United States Patent [19]

Terasawa et al.

[11] Patent Number: 5,194,092
[45] Date of Patent: Mar. 16, 1993

[54] ELECTROSTATIC COATING APPARATUS FOR FLAT-PLATE TYPE OBJECTS

[75] Inventors: Hideo Terasawa; Thoru Takeuchi, both of Hiratsuka, Japan

[73] Assignee: Kansai Paint Co., Ltd., Hyogo, Japan

[21] Appl. No.: 732,124

[22] Filed: Jul. 18, 1991

[30] Foreign Application Priority Data

Jul. 19, 1990 [JP] Japan .................................. 2-189413

[51] Int. Cl.⁵ .............................................. B05B 5/00
[52] U.S. Cl. ...................................... 118/632; 118/324
[58] Field of Search ............... 118/632, 634, 635, 323, 118/324, 309; 198/377, 378, 680

[56] References Cited

U.S. PATENT DOCUMENTS 4,600,601 7/1986 Tamura ........................... 118/323

FOREIGN PATENT DOCUMENTS 164899 12/1985 European Pat. Off. ............. 118/632

Primary Examiner—W. Gary Jones
Assistant Examiner—Charles K. Friedman
Attorney, Agent, or Firm—Wenderoth, Lind & Ponack

[57] ABSTRACT

An electrostatic coating apparatus for flat-plate type objects to be coated, comprising a conveyor carrying flat-plate type objects to be coated and having two parallel and linear portions which carry said objects in opposite directions and which are each L in length and are spaced 2R apart, said L and R having the relationship L≧2R; a reversing device which receives coated objects carried from one linear portion and which reverses said objects before feeding them to the other linear portion; a rotary spray head of which the axis of rotation is centrally situated between said linear portions of the conveyor and extends in a vertical direction; and a supporting device which subjects the rotary spray head to reciprocation along said axis of rotation.

2 Claims, 2 Drawing Sheets

ELECTROSTATIC COATING APPARATUS FOR FLAT-PLATE TYPE OBJECTS

The present invention relates to electrostatic coating appratuses for subjecting flat-plate type objects to be coated, such as printed circuit boards, etc., to electrostatic coating with a coating material such as a solder resist, etc.

BACKGROUND OF THE INVENTION

For methods for applying a coating material such as solder resist, etc., to flat-plate type objects to be coated, such as printed circuit boards, etc., there is a method of coating by means of screen printing, a method of coating by means of subjecting an air or airless coater to reciprocation while objects to be coated are being carried by a conveyor, and the like.

These conventional coating methods, however, have the disadvantage that transfer efficiency of the coating material is insufficient, although a relatively uniform distribution of film thickness can be obtained. Furthermore, another disadvantage is that, in the case of coating with an aqueous solder resist coating material, air is caught up to form bubbles, which are contained in the coating.

Moreover, apparatuses such as an air spray electrostatic coating apparatus, an airless spray electrostatic coating apparatus and the like have been proposed, but the above disadvantages have not thoroughly been obviated.

Next, also known is a method of coating by means of subjecting a bell-shaped electrostatic coater used as a rotary spray-type electrostatic coater to reciprocation while the objects to be coated are being carried by a conveyor. In this method, however, it is difficult to obtain a relatively uniform distribution of film thickness because spray patterns are hollow and of large sizes. A proposal has been made to alter those spray patterns by means of shaping air, etc., but this alteration by shaping air, etc., would cause problems such as a drop in transfer efficiency, etc. Furthermore, in the case of coating on both sides of an object to be coated, in a consecutive manner by means of using a bell-shaped electrostatic coater, two such coaters are required; accordingly, an increase in initial cost would become another problem.

Moreover, a method of coating by means of using a disc-shaped electrostatic coater has the disadvantage that, although transfer efficiency is high, some difference in size between flat-plate type objects to be coated would cause film thickness to be non-uniform because those objects to be coated are carried in a circle with the coater as its center. Besides, in the case of double-size coating which is performed while objects to be coated are rotating, problems such as a rise in film thickness on edge portions of the coated objects, etc., would arise.

SUMMARY OF THE INVENTION

An objective of this invention is to provide an electrostatic coating apparatus which enables both sides of flat-plate type objects to be uniformly coated.

Another objective of this invention is to provide an electrostatic coating apparatus which is capable of forming coatings not containing bubbles while keeping transfer efficiency sufficiently high.

According to this invention, the above objectives can be accomplished by providing an electrostatic coating apparatus for flat-plate type objects to be coated, comprising a conveyor carrying flat-plate type objects to be coated and having two parallel and linear portions which carry said objects in opposite directions and which are each L in length and are spaced 2R apart, said L and R having the relationship $L \geq 2R$; a reversing device which receives coated objects carried from one linear portion and which reverses said objects before feeding them to the other linear portion; a rotary spray head of which the axis of rotation is centrally situated between said linear portions of the conveyor and extends in a vertical direction; and a supporting device which subjects the rotary spray head to reciprocation along said axis of rotation.

DESCRIPTION OF THE PREFERRED EMBODIMENT

Figure 1:
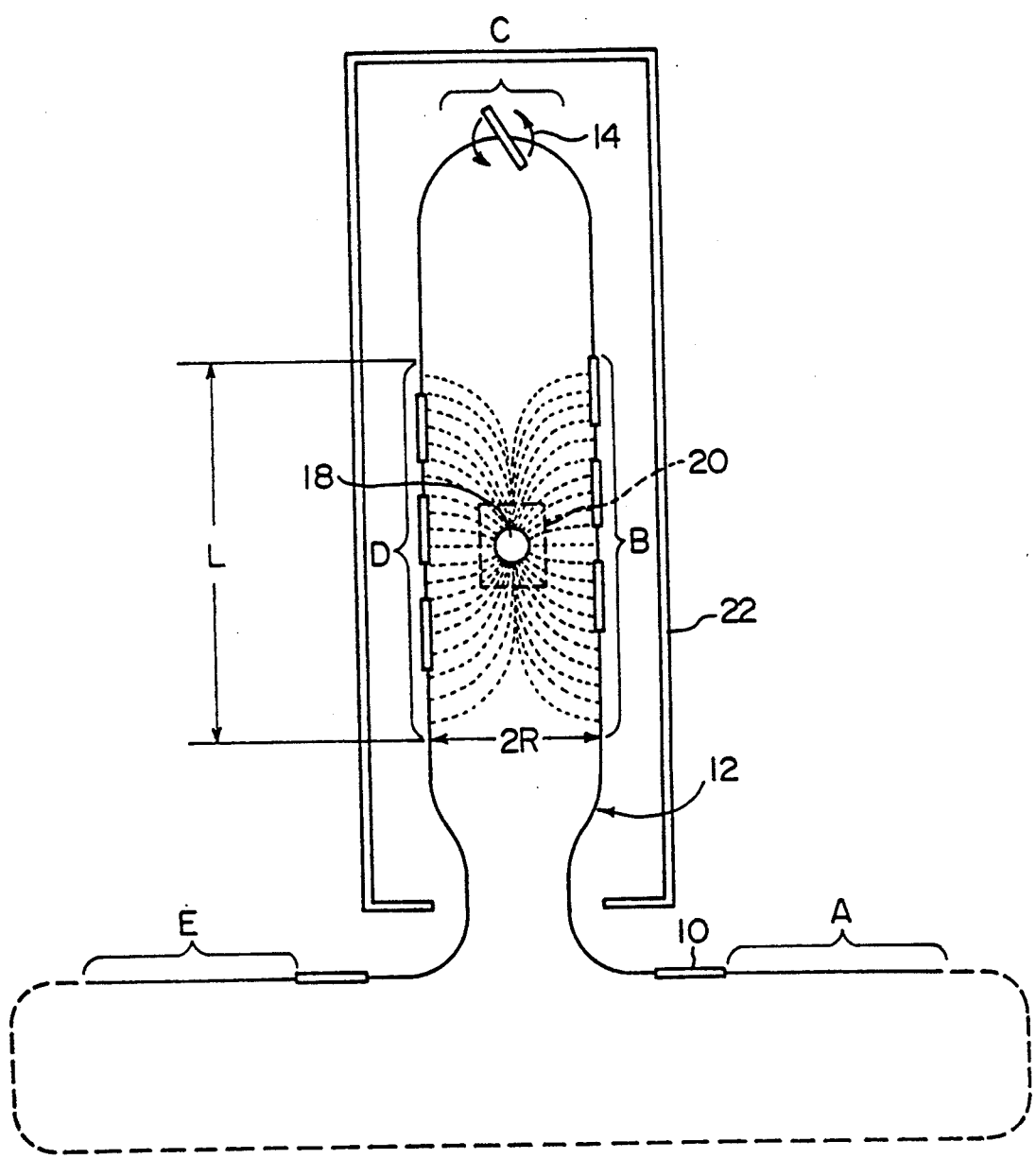
FIG. 1 is a simplified plan view of an electrostatic coating apparatus for flat-plate type objects to be coated, in accordance with a preferred embodiment of this invention.

Next, an electrostatic coating apparatus for flat-plate type objects to be coated, in accordance with a preferred embodiment of this invention, will be explained by reference to FIGS. 1 and 2.

This electrostatic coating apparatus comprises a loop conveyor 12 for carrying flat-plate type objects 10 to be coated, a reversing device 14, a sprayer 18 having a rotary spray head 16 (shown in FIG. 2), a supporting device 20 for supporting the sprayer 18, and a coating booth 22.

The loop conveyor 12 is provided with a chain 24 which is driven to move along a predetermined loop line, a plurality of hangers 26 connected with the chain 24 at given pitches, and a drive (not shown) for driving the chain 24 to move along the predetermined line at a constant speed.

The hangers 26 are supported with a plurality of flat-plate type objects 10 being suspended therefrom at given pitches. For the purpose of making a film of coating uniform, it is preferable that the space "d" between flat-plate type objects 10 to be coated should be 50 mm or less.

The loop conveyor 12 has an attachment portion A, a first linear portion B, a reversal portion C, a second linear portion D, and a detachment portion E.

At the attachment portion A, the flat-plate type objects 10 to be coated are suspended from the hangers 26 in order.

The first linear portion B and the second linear portion D are parallel to each other, and they are each L in length and are spaced 2R apart. At these linear portions, said objects are carried in opposite directions. It is necessary that said L and R have the relationship $L \geq 2R$, in order for front and back surfaces of the flat-plate type objects 10 to be uniformly coated.

At the reversal portion C, the reversing device 14 as mentioned below is disposed, and the coated flat-plate type objects 10 are reversed so as to rotate in a 180-degree arc.

At the detachment portion E, the coated flat-plate type objects 10 are detached.

In the embodiment shown in FIG. 1, the attachment portion A and the detachment portion E are arranged so as to be adjacent to the first and second linear portions B and D, respectively. But the attachment portion A and the detachment portion E may be disposed at some distance from the first and second linear portions B and D, and a device for performing a various types of pre-treatment or post-treatment, etc., may be disposed between them.

The reversing device 14 reverses the front and back surfaces of the coated flat-plate type objects 10 suspended from the hangers 26. Thus, one face of a flat-plate type object 10 to be coated is subjected to coating at the first linear portion B and the opposite face is subjected to coating at the second linear portion D.

The sprayer 18 has the rotary spray head 16, and the axis of rotation of the rotary spray head 16 extends in a vertical direction. The rotary spray head 16 atomizes a coating material and radiately discharges a spray thereof. As a rotary spray head 16, a disc-shaped head, a bell-shaped head and the like can be used. Static voltage is being applied between the rotary spray head 16 and some flat-plate type objects 10, and the coating material atomized by the rotary spray head 16 is attracted to those flat-plate type objects 10 in the coating area by static electricity so that the objects are coated therewith.

The linear portions B and D of the loop conveyor 12 are located in the coating area where the flat-plate type objects 10 get coated with the coating material.

The sprayer 18 is supported by the supporting device 20 such that the axis of rotation extending in a vertical direction from the rotary spray head 16 is centrally situated between two parallel linear portions B and D, i.e., in the middle of the width (horizontal direction in FIG. 1) from the portion B to the portion D and in the middle of the length (vertical direction in FIG. 1) of each portion.

The rotary spray head 16 is subjected to reciprocation along its axis of rotation by the supporting device 20.

As shown in FIG. 1, it is preferable that the first linear portion B, the reversal portion C and the second linear portion D of the loop conveyor 12 carrying the flat-plate type objects 10 to be coated, the reversing device 14 and the sprayer 18 having the rotary spray head 16 should be disposed so as to be confined in the coating booth 22 for the purpose of preventing outside contamination caused by the coating material.

Operation of this electrostatic coating apparatus for flat-plate type objects to be coated is as follows.

The loop conveyor 12 is actuated to allow the chain 24 to move at a constant speed. At the attachment portion A, the flat-plate type objects 10 to be coated are suspended in order from the hangers 26 connected with the chain 24 at given pitches.

The sprayer 18 and the supporting device 20 are actuated. The rotary spray head 16 of the sprayer 18 radiately discharges a spray of the coating material. The supporting device 20 causes the rotary spray head 16 to undergo reciprocation in a vertical direction.

At the first linear portion B, one face of a flat-plate type object 10 suspended from a hanger 26 is uniformly coated.

The coated flat-plate type object 10 is caused to rotate in a 180-degree arc by the reversing device 14 at the reversal portion C.

The other face of the coated flat-plate type object 10 is uniformly coated at the second linear portion D.

By removing the reversing device 14 at the reversal portion C, it is made possible to subject only one face of the object to a double coating, without reversal.

At the detachment portion E, the flat-plate type object 10 both faces of which have been coated is detached from the hanger 26.

EXAMPLE 1

Flat-plate type objects of W in width were subjected to coating by means of using an electrostatic coating apparatus in accordance with prior art and an electrostatic coating apparatus for flat-plate type objects to be coated, in accordance with FIG. 1.

In a conventional apparatus, spray distance R, i.e., the distance between the rotary spray head and the flat-plate type object to be coated, was fixed at 250 mm. There is no linear portion in the conventional apparatus and, accordingly, L is zero (L=0).

Figure 2:
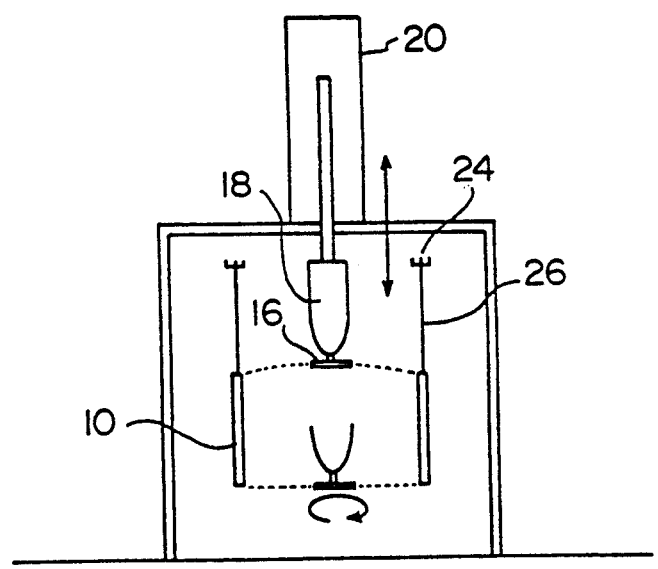
FIG. 2 is a partial sectional view of the apparatus of FIG. 1.

As an apparatus having linear portions in accordance with this invention, an apparatus which is as shown in FIGS. 1 and 2 and of which the first and second linear portions B and D have a length L of 700 mm was used. Spray distance R is 250 mm.

The following Table 1 shows uniformity of film thickness on the flat-plate type objects of W in width coated by means of using the above conventional apparatus and apparatus having the linear portions in accordance with this invention.

TABLE 1

| W (mm) | L (mm) | Uniformity of film thickness |
|---|---|---|
| 200 | 0 | ±7.2% |
| 300 | 0 | ±11.1% |
| 400 | 0 | ±19.9% |
| 400 | 700 | ±6.9% |

As is clear from Table 1, the use of the apparatus having the linear portions in accordance with this invention enables more excellent uniformity of film thickness to be obtained.

EXAMPLE 2

Flat-plate type objects having a width W of 400 mm were subjected to coating by means of using apparatuses as shown in FIGS. 1 and 2, which are:

(a) an apparatus which has a spray distance R of 150 mm and of which the first and second linear portions B and D have a length L of 500 mm, (b) an apparatus which has a spray distance R of 250 mm and of which the first and second linear portions B and D have a length L of 700 mm and (c) an apparatus which has a spray distance R of 350 mm and of which the first and second linear portions B and D have a length L of 900 mm.

Uniformity of film thickness and transfer efficiency were examined for each of the above apparatuses. The following Table 2 shows the results.

TABLE 2

| | R (mm) | L (mm) | Uniformity of film thickness | Transfer efficiency |
|---|---|---|---|---|
| (a) | 150 | 500 | ±4.8% | 96% |
| (b) | 250 | 700 | ±6.9% | 93% |
| (c) | 350 | 900 | ±9.4% | 89% |

Transfer efficiency indicates the weight ratio of solid parts of the coating material on the coated object to solid parts of the coating material discharged from the sprayer.

It can be understood from these findings that excellent results are produced in the case of L≧2R.

EXAMPLE 3

Flat-plate type objects having a width W of 400 mm and being spaced "d" apart were subjected to coating by means of using an apparatus, as shown in FIGS. 1 and 2, which has a spray distance R of 250 mm and of which the first and second linear portions B and D have a length L of 700 mm. The following Table 3 shows the results.

TABLE 3

| d (mm) | Film thickness ($\mu$) | | Uniformity of film thickness |
|---|---|---|---|
| | (maximum | minimum) | |
| 10 | 25 | 26 | ±2.0% |
| 20 | 25 | 27 | ±3.8% |
| 40 | 25 | 28 | ±5.7% |
| 60 | 24 | 30 | ±11.1% |
| 80 | 24 | 31 | ±12.7% |
| 160 | 24 | 34 | ±17.2% |

Since it is preferable that the maximum and minimum values of film thickness fall within the range of ±10% (uniformity of film thickness) of the average value thereof, it can be understood from these findings that a space "d" of less than 50 mm between objects to be coated is preferred.

What is claimed is;

1. An electrostatic coating apparatus for flat-plate type objects to be coated, comprising a conveyor carrying flat-plate type objects to be coated and having two linear portions which are parallel to each other, which carry said objects in opposite directions and which are each L in length and are spaced 2R apart, said L and R having the relationship L≧2R; a reversing device which receives coated objects carried from one linear portion and which rotates said objects before feeding them to the other linear portion such that the opposite face of the object is presented for electrostatic coating; a rotary spray head of which the axis of rotation is centrally situated between said linear portions of the conveyor and extends in a vertical direction; and a supporting device which subjects the rotary spray head to reciprocation along said axis of rotation.

2. The electrostatic coating apparatus according to claim 1, wherein the conveyor is provided wit hangers supporting flat-plate type objects for coating which are in the state of being suspended therefrom at spaces of "d" from each other less than or equal to 50 mm.

* * * * *